(12) United States Patent
Menard et al.

(10) Patent No.: US 8,552,467 B2
(45) Date of Patent: Oct. 8, 2013

(54) FOUR-QUADRANT TRIAC

(75) Inventors: Samuel Menard, Tours (FR); Dalaf Ali, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 13/313,174

(22) Filed: Dec. 7, 2011

(65) Prior Publication Data

US 2012/0146089 A1  Jun. 14, 2012

(30) Foreign Application Priority Data

Dec. 9, 2010  (FR) .................................... 10 60326

(51) Int. Cl.
*H01L 29/66* (2006.01)
(52) U.S. Cl.
USPC .................................. 257/119; 257/E29.215
(58) Field of Classification Search
USPC ................. 257/119, 126, 154, 173, 500, 504, 257/524, 544, 547, 146, 132, 175, E21.544, 257/E27.051, E27.052, E29.215
See application file for complete search history.

(56) References Cited

U.S. PATENT DOCUMENTS

| | | | |
|---|---|---|---|
| 4,812,893 A * | 3/1989 | Bacuvier ........................ | 257/119 |
| 4,903,105 A | 2/1990 | Najji | |
| 4,994,885 A | 2/1991 | Yoshizawa | |
| 2007/0145408 A1 * | 6/2007 | Menard .......................... | 257/107 |

FOREIGN PATENT DOCUMENTS

GB  1220894 A  1/1971

OTHER PUBLICATIONS

French Search Report and Written Opinion dated Jun. 7, 2011 from corresponding French Application No. 10/60326.

* cited by examiner

*Primary Examiner* — Yu-Hsi D Sun
*Assistant Examiner* — Christina Sylvia
(74) *Attorney, Agent, or Firm* — Wolf, Greenfield & Sacks, P.C.

(57) ABSTRACT

A vertical four-quadrant triac wherein the gate region, arranged on the side of a front surface, includes a U-shaped region of a first conductivity type, the base of the U lying against one side of the structure, the main front surface region of the second conductivity type extending in front of the gate region and being surrounded with portions of the main front surface region of the first conductivity type.

14 Claims, 6 Drawing Sheets

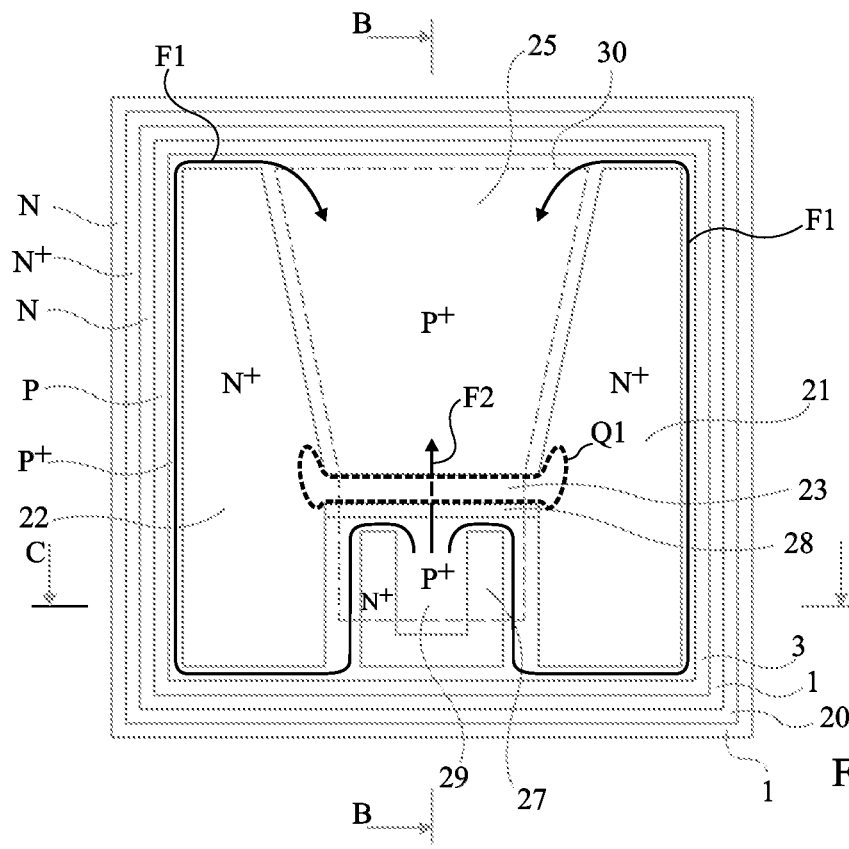
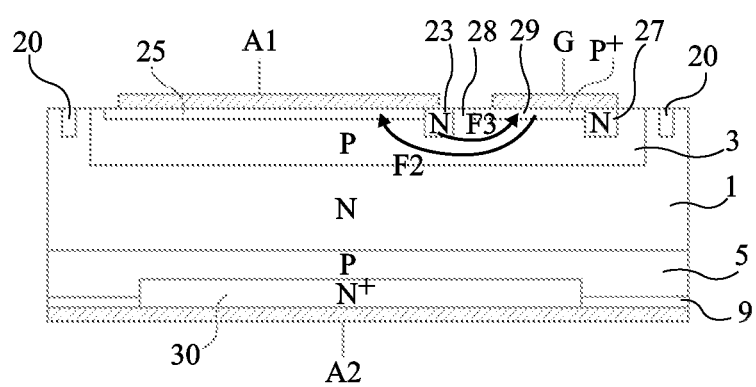
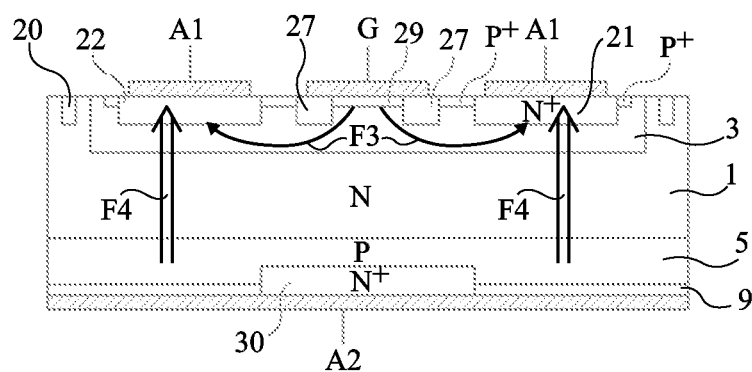

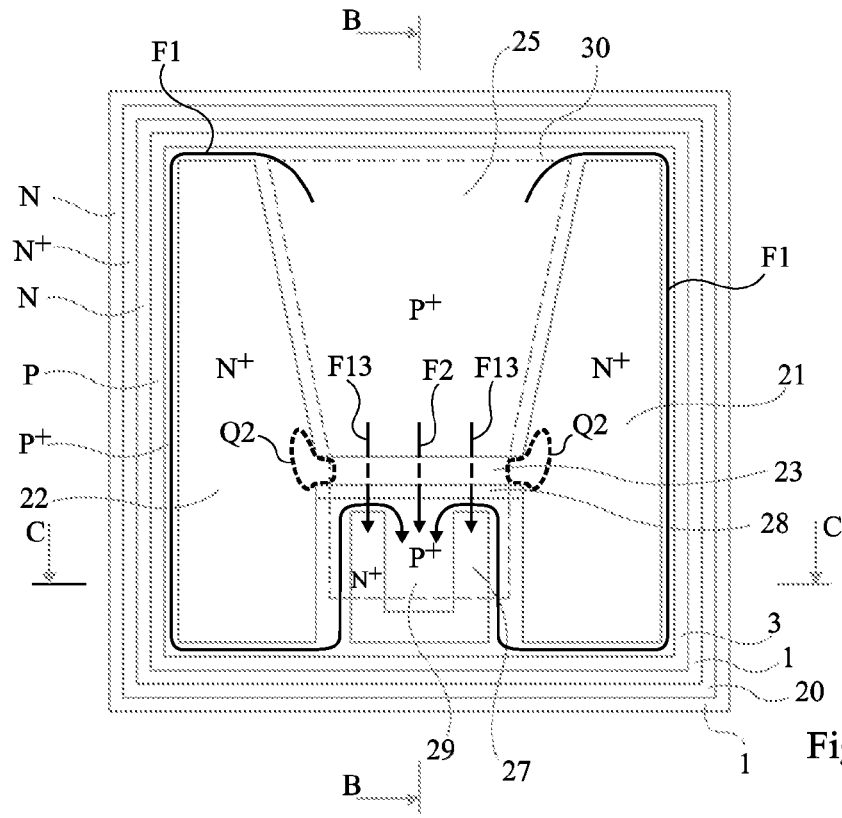
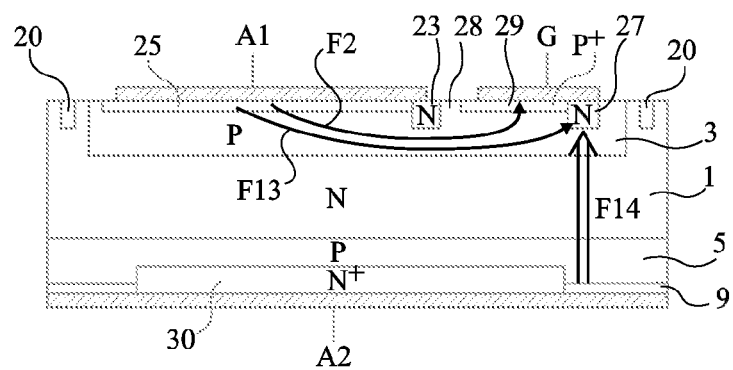
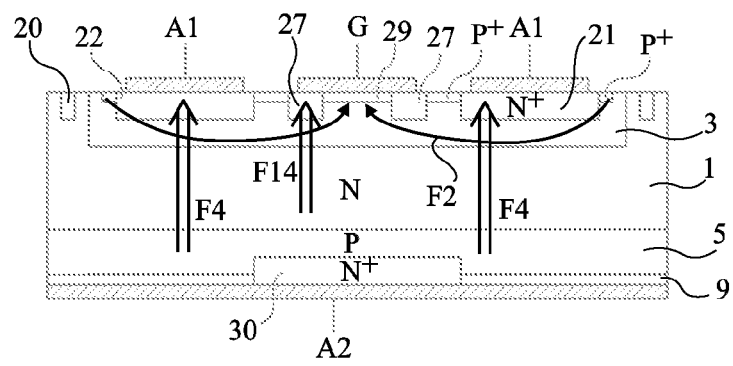
Fig 4A
Fig 4B
Fig 4C

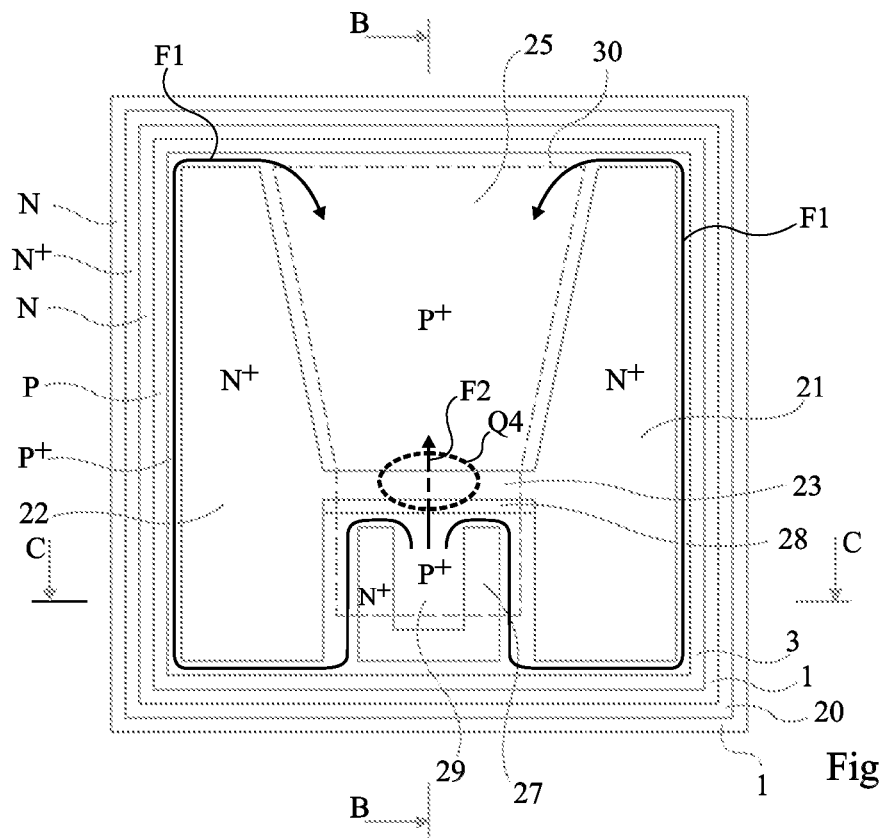
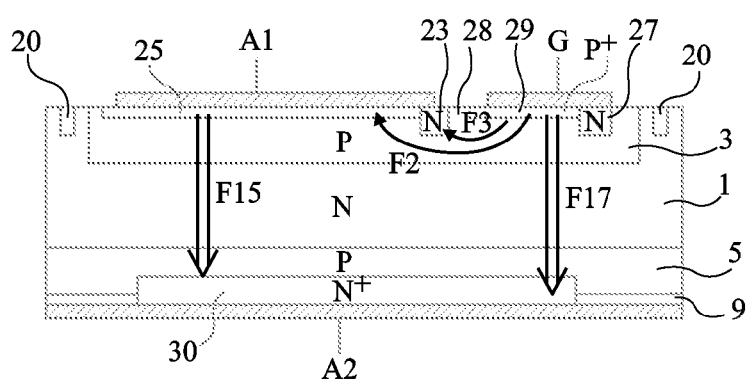
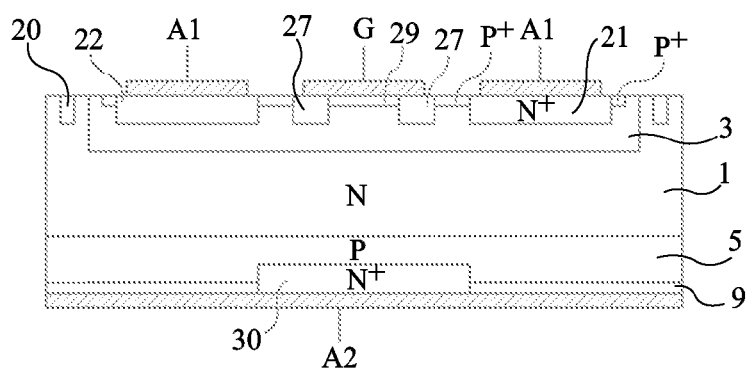
Fig 6A
Fig 6B
Fig 6C

FOUR-QUADRANT TRIAC

CROSS REFERENCE TO RELATED APPLICATIONS

This application claims the priority benefit of French patent application number 10/60326, filed on Dec. 9, 2010, entitled FOUR-QUADRANT TRIAC, which is hereby incorporated by reference to the maximum extent allowable by law.

BACKGROUND OF THE INVENTION

1. Field of the Invention

The present invention relates to a triac, and more specifically to a triac having similar sensitivities in the four triggering quadrants.

2. Discussion of Related Art

Vertical triacs, that is, triacs comprising, on a so-called rear surface, a first main electrode (A2) and, on the opposite or front surface, a second main electrode (A1) and a gate electrode (G), are considered herein. Generally, a triac comprises, side-by-side, PNPN and NPNP structures forming two head-to-tail thyristors. A portion of the front surface is dedicated to the trigger or gate structure and enables, when a voltage is applied between the gate electrode and the main front surface electrode, to trigger the thyristor, which is properly biased for the applied voltage.

Currently, triacs are formed within a substantially square contour, the PNPN and NPNP thyristors substantially taking up half of the useful surface area, and a small portion of this surface area being dedicated to the triggering structure, which is generally arranged in a corner of the square.

Four triggering quadrants are generally distinguished according to the voltages present on the main electrodes and on the gate electrode. Calling A2 the main rear surface electrode and A1 the main front surface electrode, and considering that main electrode A1 which is used as a reference for the gate is at a zero voltage, the four quadrants, Q1, Q2, Q3, Q4 are defined as follows

|    | A1 | A2 | G  |
|----|----|----|----|
| Q1 | 0  | >0 | >0 |
| Q2 | 0  | >0 | <0 |
| Q3 | 0  | <0 | <0 |
| Q4 | 0  | <0 | >0 |

FIGS. 1A, 1B, and 1C respectively show a top view, a cross-section view along line B-B, and a cross-section view along line C-C of FIG. 1A of a conventional corner gate triac. Reference will be made hereafter to all these drawings.

The structure is built from a lightly-doped N-type semiconductor substrate 1. It comprises a P-type well 3 on the front surface side and a P-type layer 5 on the rear surface side. A first NPNPP$^+$ thyristor between main electrode A1 and main electrode A2 comprises a heavily-doped N-type region 7 formed in P well 3 and regions 3, 1, and 5, as well as a more-heavily doped P-type region 9 on the rear surface side. The second P$^+$PNPN thyristor between main electrode A1 and main electrode A2 comprises a P$^+$ region 11 formed in the upper portion of P well 3 in contact with electrode A1 and, on the rear surface side, a heavily-doped N-type region 13 in contact with electrode A2. These two thyristors generally have substantially equal surface areas.

The triggering structure is formed in P well 3. It comprises a heavily-doped N-type region 15 generally having a specific shape of the type shown in FIG. 1A, surrounded with a heavily-doped P-type region 17. The gate metallization is in contact with these two regions 15 and 17. It should be noted, by observing FIGS. 1A and 1B, that a P-type well region 18, which is not overdoped, exists between gate regions 15, 17 and main regions 7, 11 of the front surface electrode. In FIG. 1A, the contour of main electrode A1 is indicated by dotted lines and the contour of gate electrode G is also indicated by dotted lines. A heavily-doped N-type region 19 is formed under the gate area, on the rear surface side.

An N$^+$-type channel stop layer 20 has been formed at the periphery of the front surface of the triac. Different types of peripheries may be used, especially according to whether the triac is of planar or mesa type. These peripheries will not be detailed herein since they are well known by those skilled in the art.

As known, in order for the triggering to occur favorably, many conditions should be complied with, and many gate topologies, as well as many shapes of N region 19 placed on the rear surface in front of the gate, have been devised. Similarly, it should be noted that, generally, the doping of well 3 (and thus of layer 5) is selected according to compromises between the sensitivity and the immunity to parasitic triggerings of the triac. P$^+$ layers 11, 17, and 9, which are necessary to provide an ohmic contact with the electrodes, will have optimized shapes to improve the triac sensitivity.

Still, those skilled in the art have to make a compromise. If the auxiliary thyristor is made too sensitive, the triac has strong dV/dt triggering risks, that is, it risks triggering when the voltage between its main terminals varies abruptly while no gate voltage is applied.

As an inevitable result, in all corner-gate structures of the type shown in FIG. 1, current $I_{GT}$ which should flow between the gate and main electrode A1 to trigger the thyristor is much greater in quadrant Q4 than in the other quadrants and the dV/dt parasitic triggering characteristic for all operating modes of the triac is not optimal.

Many other alternative embodiments of triacs are known by those skilled in the art. In particular, generally, so-called emitter short-circuit holes are provided in main N$^+$ front surface and N$^+$ rear surface regions 7 and 13. This means that each of the N$^+$ layers is locally interrupted so that the P region in which it is formed makes flush at the level of these interrupts.

The triggering mode of this structure in mode Q4 (A2<0, G>0) is the following. When a positive voltage is applied to the gate with respect to main electrode A1, a current flows from gate metallization G into P region 17 and travels to P$^+$ region 11. The flowing of this current, especially through region 18 along N$^+$ region 7, creates a voltage drop greater than 0.6 V and makes the junction between P well 3 and N$^+$ region 7 conductive. This results in a carrier generation under the gate region and this strong injection carrier generation modifies the naturally blocking behavior of the junction between P well 3 and substrate 1. The auxiliary thyristor comprising regions 17-3-1-5-19 turns on and its turning-on causes the turning-on of main thyristor 11-3-1-5-13.

FIG. 1A shows the area in which the triggering starts in quadrant Q4 (reference Q4). The starting area in quadrants Q1 and Q2 (reference Q1,Q2) and the starting area in quadrant Q3 (reference Q3) have been similarly shown. It should be noted that the triggering areas are clearly separate, which enables to better understand the difficulty of balancing the triggering sensitivities in the various quadrants.

SUMMARY OF THE INVENTION

An object of embodiments is to overcome the disadvantages of known triac structures, and especially to improve the triggering symmetry of a triac in the four quadrants while providing a triac with a strong immunity to parasitic dV/dt triggerings.

In one embodiment, it is suggested to modify the position of the gate area and, instead of arranging this gate area in the corner as usually done in current triacs, or centrally as in triacs manufactured many years ago, to arrange it substantially in the middle of one side of the structure.

More specifically, an embodiment provides a vertical four-quadrant triac wherein the gate region, arranged on the side of a front surface, comprises a U-shaped region of a first conductivity type, the base of the U lying against one side of the structure, the main front surface region of the second conductivity type extending in front of the gate region and being surrounded with portions of the main front surface region of the first conductivity type.

According to an embodiment, the two main front surface regions of the first conductivity type join in an area of the first conductivity type separating the gate region of the second conductivity type from the main region of the second conductivity type.

According to an embodiment, the main rear surface region of the first conductivity type extends under the main front surface region of the second conductivity type and under a portion of the gate region of the second conductivity type.

According to an embodiment, a lightly-doped region of the second conductivity type is maintained in the vicinity of said area of the first conductivity type, on the gate side.

According to an embodiment, the first conductivity type is type N and the second conductivity type is type P.

BRIEF DESCRIPTION OF THE DRAWINGS

The foregoing and other objects, features, and advantages will be discussed in detail in the following non-limiting description of specific embodiments in connection with the accompanying drawings.

FIGS. 3A, 3B, 3C, 4A, 4B, 4C, 5A, 5B, 5C, and 6A, 6B, 6C respectively correspond to FIGS. 2A, 2B, 2C and illustrate the triggering paths of the triac of FIG. 2 in each of the four quadrants.

For clarity, the same elements have been designated with the same reference numerals in the different drawings and, further, as usual in the representation of integrated circuits, the various drawings are not to scale.

DETAILED DESCRIPTION

Figure 2A:
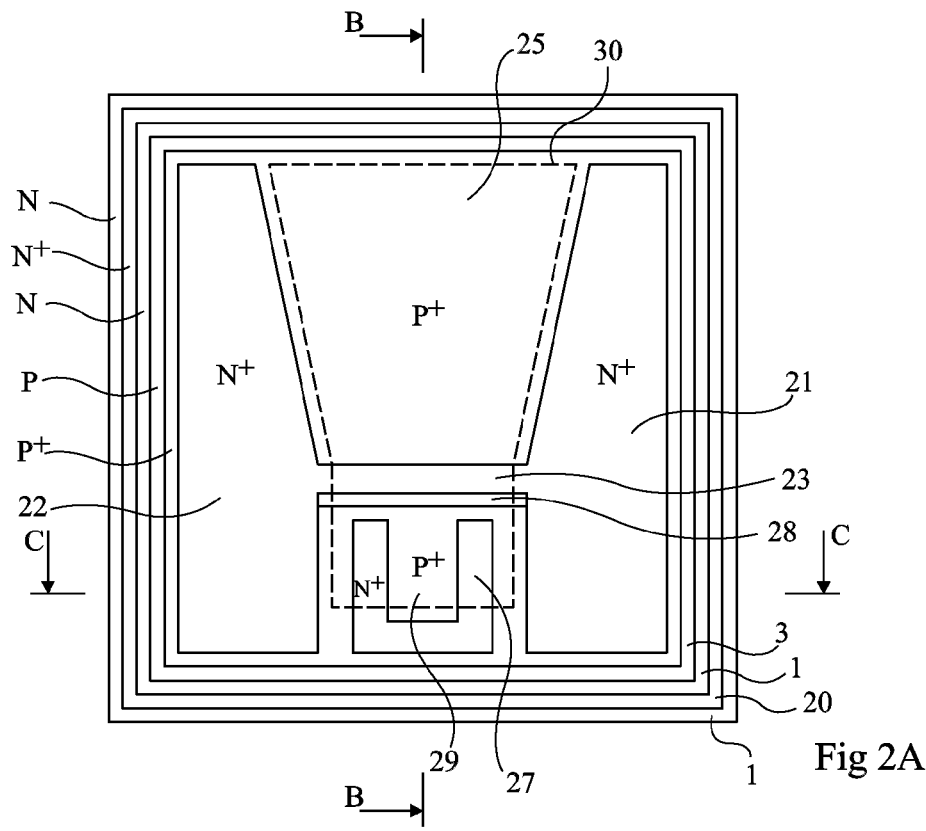
FIG. 2A is a top view of a triac according to an embodiment of the present invention and FIGS. 2B and 2C are cross-section views of the triac of FIG. 2A.
Figure 2B:
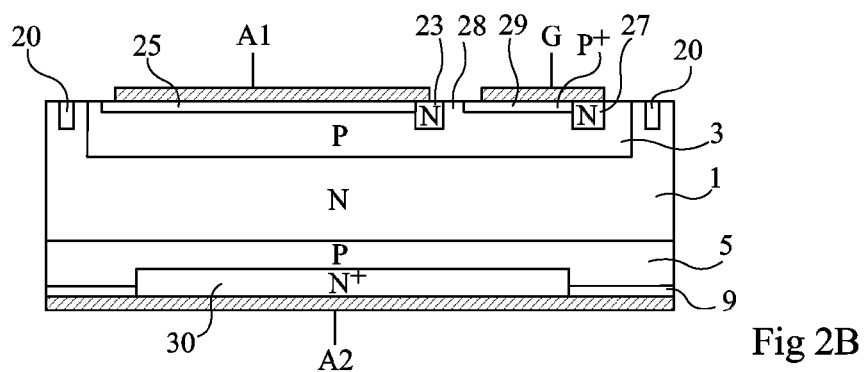
Figure 2C:
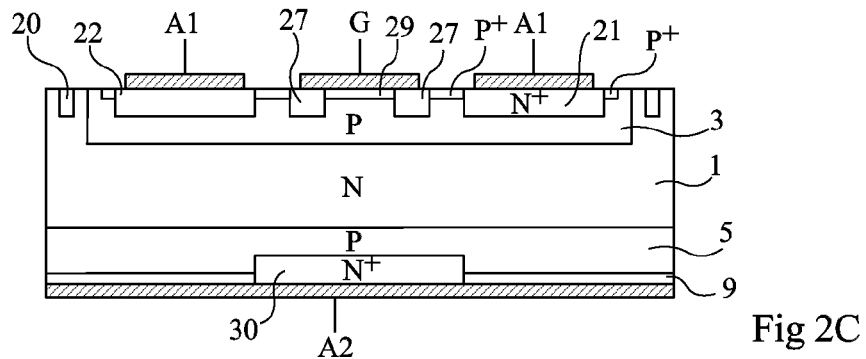

FIGS. 2A, 2B, 2C respectively show a top view, a cross-section view along direction BB, and a cross-section view along direction CC of FIG. 2A of a triac.

This triac comprises the same periphery as the previously shown conventional triac but, as already noted, many variations may be adapted and many types of peripheries may be used, especially according to whether a triac of planar type or of mesa type is desired to be formed.

This triac comprises the same layers and regions as the previously-described triac but they are distributed and arranged differently to optimize the flowing of the triggering currents. It especially comprises lightly-doped N-type substrate 1, P-type well 3 formed on the front surface side, and P-type layer 5 formed on the rear surface side, as well as overdoped portion 9 of layer 5. In well 3, the main $N^+$ front surface region is arranged symmetrically, is substantially H-shaped and comprises two main elements 21 and 22 corresponding to the two arms of the H and a central bar 23. Main $P^+$ front surface region 25 is arranged between the arms of the H (at the top of the drawing) and takes up a surface area substantially equal to that of $N^+$ regions 21, 22, 23 altogether. A first main electrode A1 covers all of regions 21, 22, 23, and 25. The gate region is arranged between the two arms of the H (at the bottom of the drawing) and comprises a heavily-doped N-type ($N^+$) U-shaped region 27 and, inside of the U, also in contact with the gate electrode, a heavily-doped P-type region 29. As illustrated in FIGS. 2A and 2B, there preferably remains a non-overdoped region 28 of P-type well 3, between gate regions 27, 29 and bar 23, of the main front surface region.

Contour 30 of main rear surface $N^+$ region has been shown with dotted lines in the top view. This region extends in front of $P^+$ region 25 and at least a portion of gate area 27, 29.

The triggering paths in the four quadrants of the above triac will now be described. FIGS. 3 to 6 reproduce FIG. 2 and indicate with arrows the current flow during the various triggering phases.

FIGS. 3A, 3B, 3C relate to quadrant Q1, (main electrode A2 is at a positive voltage and gate electrode G is at a positive voltage, main electrode A1 being at a zero voltage). In this case, when a control voltage is applied between G and A1, a current tends to flow from $P^+$ gate region 29 to $P^+$ main region 25. This current flows in the direction indicated by arrows F1 all around $N^+$ regions 21 and 22 and in the direction indicated by arrow F2 under $N^+$ arm 23. Current F2 in FIG. 3B has also been indicated. This causes the conduction of the PN junction between the P well and $N^+$ regions 21, 22, 23. Then, a current tends to flow in the direction indicated by arrows F3 visible in FIGS. 3B and 3C. The starting of the conduction of the junction between P well 3 and regions 21, 22, 23 causes the generation of carriers in well 3, thus lowering the naturally blocking barrier of the junction between this well and substrate 1. As a result, the thyristor formed between electrodes A2 and A1 by regions 9-5-1-3-(21,22) triggers, as indicated by double arrows F4.

FIGS. 4A, 4B, and 4C illustrate the triggering in quadrant Q2, that is, when A2 is positive and G is negative with respect to A1. At the beginning of the triggering, current flows F1, F2 are present, but in reverse direction with respect to FIGS. 3A, 3B, 3C. This starts the conduction of the PN junction between P well 3 and $N^+$ gate region 27. Thus, a current tends to flow in the direction indicated by arrows F13. The starting of the conduction of the junction between P well 3 and $N^+$ gate region 27 causes the generation of carriers in well 3, thus lowering the naturally blocking barrier of the junction between this well and substrate 1. This results in the triggering of gate thyristor 9-5-1-3-27 (arrows F14), and then of main thyristor 9-5-1-3-(21,22) (arrows F4).

Figure 5A:
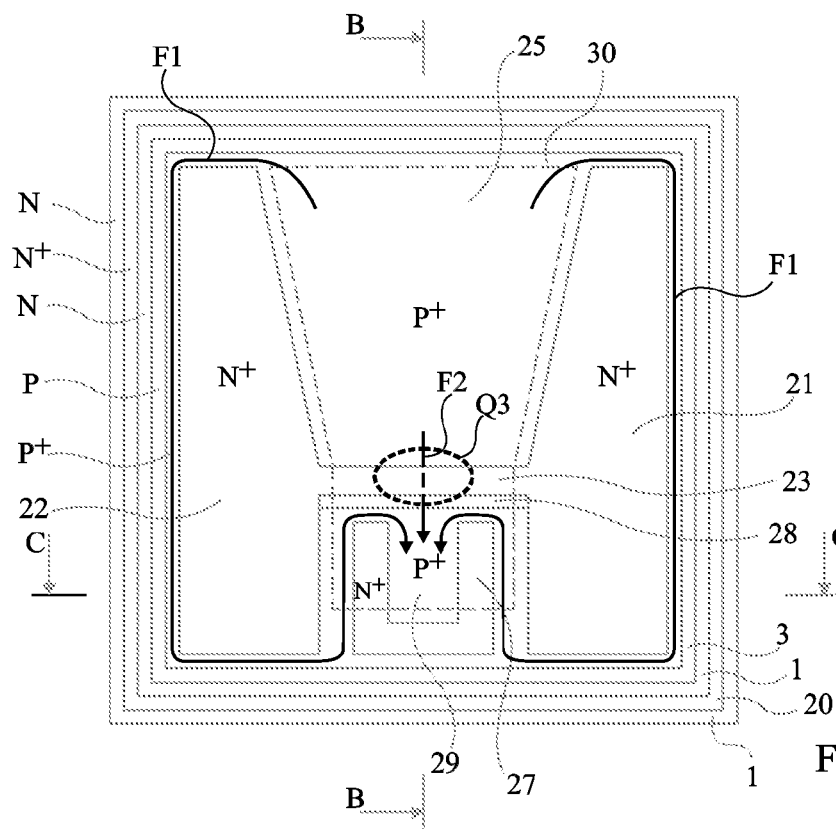
Figure 5B:
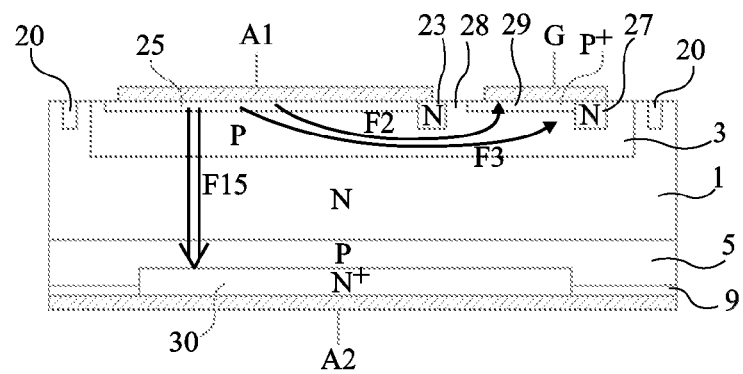
Figure 5C:
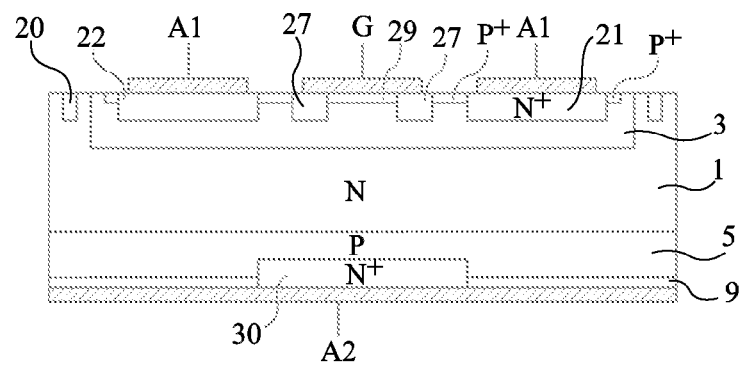

FIGS. 5A, 5B, and 5C illustrate a triggering in quadrant Q3, and FIGS. 6A, 6B, and 6C illustrate a triggering in quadrant Q4. In quadrants Q3 and Q4, main $P^+$PNPN thyristor 25-3-1-5-30 is likely to turn on. The same turn-on current flows as in the triggerings in the first and second quadrants can be found. The events occur in order F1-F2, F3, F15 for quadrant Q3 and F1-F2, F3, F17, F15 for quadrant Q4.

The turn-on regions in each of quadrants Q1 to Q4 have been indicated in each of FIGS. 3A to 6A.

Thus, this provides a significant advantage of the device according to the present invention, which is that the current paths leading to the triggering of the triac are very similar, with a possible inversion of the current direction in the four quadrants. Further, the turn-on areas are the same in quadrants Q1 and Q2, on the one hand, and in quadrants Q3 and Q4, on the other hand, and the turn-on areas in the four quadrants are close to one another. As a result, and as proved by experimentations, the sensitivity is the same in all four quadrants. No specific measures need to be taken to favor one quadrant over the others.

Figure 1A:
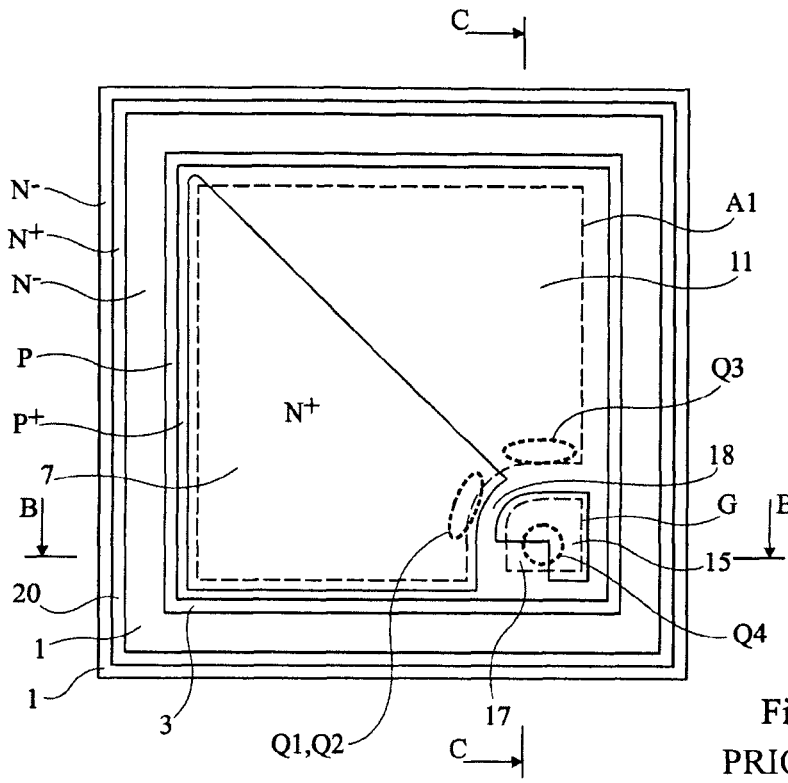
FIGS. 1A, 1B, 1C respectively are a top view and cross-section views of a conventional triac.
Figure 1B:
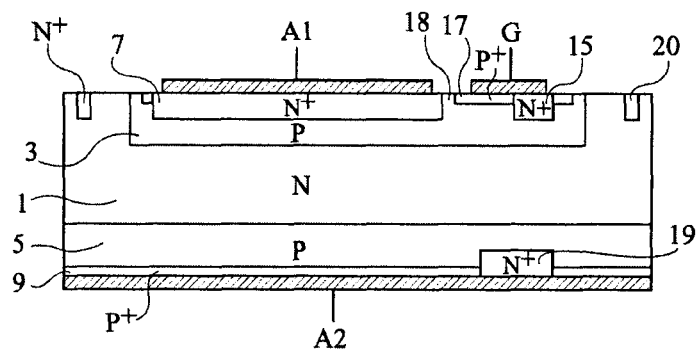
Figure 1C:
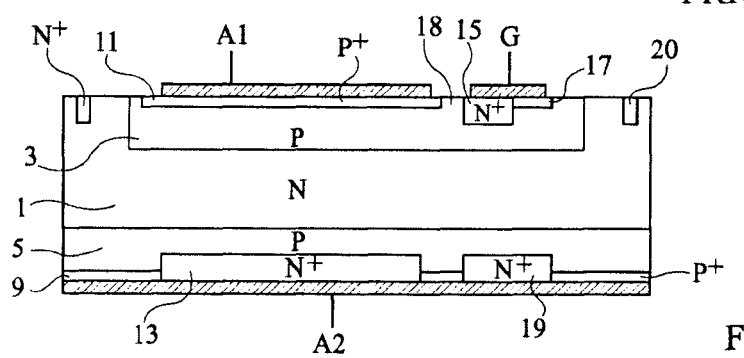

Experimentations have shown that, when the auxiliary gate thyristor triggers first, this triggering is very rapidly followed by the triggering of the main thyristor and occurs close to the end of the branches of the U. The provision of a significant penetration of the rear surface $N^+$ region under the gate is thus not necessary, which increases the immunity of the triac to dV/dt parasitic triggerings. Thus, comparative studies between the triac of FIGS. 2A-2C and a prior art triac such as shown in FIGS. 1A-1C show that the triac described herein turns on in all four quadrants with the same gate current as the current useful to the triggering in quadrants Q1, Q2, Q3 of the conventional triac. Further, an almost ten times greater immunity to dV/dt parasitic triggerings has been observed.

Of course, the drawings are all relatively simplified, and while the various regions have been shown with square corners, in practice, conventionally, these corners will be rounded to avoid various parasitic phenomena.

An overdoped P-type region, noted $P^+$ (regions 9, 25, 29) has been shown each time a contact had to be formed between a P-type layer or well and an electrode. It should be noted that in certain embodiments, such overdoped regions may be omitted, if the doping of the well or layer is sufficient and/or the metal-silicon contacts are improved. Further, all conductivity types may be inverted.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical four-quadrant triac wherein a gate region, arranged on a side of a front surface, comprises a U-shaped region of a first conductivity type, a base of the U-shaped region lying towards one side of a structure of the triac, a main front surface region of a second conductivity type extending in front of the gate region and being surrounded with portions of a main front surface region of the first conductivity type, wherein the gate region is located at the middle of said one side of the structure of the triac and is located closer to said one side than to an opposite side of the structure of the triac.

2. The triac of claim 1, wherein two portions of the main front surface region of the first conductivity type join in an area of the first conductivity type separating the gate region from the main front surface region of the second conductivity type.

3. The triac of claim 2, wherein a region of the second conductivity type is maintained between said area of the first conductivity type and the gate region.

4. The triac of claim 1, wherein a main rear surface region of the first conductivity type extends under the main front surface region of the second conductivity type and under a portion of the gate region.

5. The triac of claim 1, wherein the first conductivity type is type N and the second conductivity type is type P.

6. A vertical four-quadrant triac comprising:
   a first layered structure;
   a second layered structure side-by-side with the first layered structure; and
   a gate structure in contact with the first and second layered structures, the gate structure including a U-shaped region of a first conductivity type, wherein the vertical four-quadrant triac has a substantially square contour and wherein the gate structure is located at the middle of one side of the square contour and is located closer to said one side of the square contour than to an opposite side of the square contour.

7. A vertical four-quadrant triac as defined in claim 1, wherein the first layered structure includes a main front surface region of a second conductivity type in front of the gate structure.

8. A vertical four-quadrant triac as defined in claim 7, wherein the second layered structure includes a main front surface region of the first conductivity type on opposite sides of the gate structure and the main front surface region of the second conductivity type.

9. A vertical four-quadrant triac as defined in claim 8, wherein the main front surface region of the first conductivity type comprises a substantially H-shaped region.

10. A vertical four-quadrant triac as defined in claim 9, wherein the H-shaped region includes two arms and a central bar, wherein the central bar is located between the U-shaped region of the gate structure and the main front surface region of the second conductivity type.

11. A vertical four-quadrant triac as defined in claim 10, wherein the gate structure is located between the two arms of the H-shaped region.

12. A vertical four-quadrant triac as defined in claim 8, wherein the main front surface region of the second conductivity type and the main front surface region of the first conductivity type have substantially the same surface areas.

13. A vertical four-quadrant triac as defined in claim 8, further comprising a main rear surface region of the first conductivity type under the main front surface region of the second conductivity type and under at least a portion of the gate structure.

14. A vertical four-quadrant triac as defined in claim 1, wherein the gate structure further comprises a region of the second conductivity type inside the U-shaped region of the first conductivity type.

\* \* \* \* \*